United States Patent
Lin et al.

(10) Patent No.: US 9,773,753 B1
(45) Date of Patent: Sep. 26, 2017

(54) SEMICONDUCTOR DEVICES AND METHODS OF MANUFACTURING THE SAME

(71) Applicant: Advanced Semiconductor Engineering, Inc., Kaohsiung (TW)

(72) Inventors: Yuan-Ting Lin, Kaohsiung (TW); Chi-Yu Wang, Kaohsiung (TW); Wei-Hong Lai, Kaohsiung (TW); Chin-Li Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/356,400

(22) Filed: Nov. 18, 2016

(51) Int. Cl.
- H01L 23/48 (2006.01)
- H01L 25/065 (2006.01)
- H01L 25/00 (2006.01)
- H01L 23/538 (2006.01)
- H01L 21/56 (2006.01)
- H01L 23/31 (2006.01)

(52) U.S. Cl.
CPC .......... *H01L 25/0655* (2013.01); *H01L 21/56* (2013.01); *H01L 23/3107* (2013.01); *H01L 23/5389* (2013.01); *H01L 25/50* (2013.01)

(58) Field of Classification Search
CPC .......... H01L 2224/48247; H01L 23/48; H01L 25/0655; H01L 21/768; H01L 2224/16227; H01L 23/5381
USPC .............. 257/723, 724, 773, 776, 784, 786; 438/106, 107, 110
See application file for complete search history.

(56) References Cited

U.S. PATENT DOCUMENTS

| | | | |
|---|---|---|---|
| 7,208,826 B2 * | 4/2007 | Sakamoto | H01L 21/4828 257/666 |
| 8,003,515 B2 | 8/2011 | Meyer et al. | |
| 8,093,722 B2 | 1/2012 | Chen et al. | |
| 8,669,656 B2 * | 3/2014 | Slupsky | G08C 17/04 257/685 |
| 8,754,522 B2 * | 6/2014 | Meyer | H01L 21/568 257/723 |
| 8,779,583 B2 * | 7/2014 | Pressel | H01L 23/5389 257/684 |
| 2005/0161785 A1 * | 7/2005 | Kawashima | H01L 23/49562 257/678 |

(Continued)

*Primary Examiner* — S. V. Clark
(74) *Attorney, Agent, or Firm* — Foley & Lardner LLP; Cliff Z. Liu

(57) ABSTRACT

A semiconductor device includes a first die, a second die, an encapsulant, a first dielectric layer, and at least one first trace. The first die includes a first surface and a second surface opposite to the first surface and includes at least one first pad disposed adjacent to the first surface of the first die. The second die includes a first surface and a second surface opposite to the first surface and includes at least one second pad disposed adjacent to the first surface of the second die. The first dielectric layer is disposed on at least a portion of the first surface of the first die and at least a portion of the first surface of the second die. The first trace is disposed on the first dielectric layer, which connects the first pad to the second pad, and the first trace comprises an end portion disposed adjacent to the first pad and a body portion, and the end portion extends at an angle $\theta_1$ relative to a direction of extension of the body portion.

24 Claims, 10 Drawing Sheets

(56) References Cited

U.S. PATENT DOCUMENTS

2008/0197463 A1* 8/2008 Otremba ............ H01L 23/49524
  257/676
2012/0187568 A1   7/2012 Lin et al.
2013/0307143 A1  11/2013 Lin et al.

* cited by examiner

SEMICONDUCTOR DEVICES AND METHODS OF MANUFACTURING THE SAME

BACKGROUND

1. Technical Field

The present disclosure relates to a semiconductor device and method of manufacturing the same, and, more particularly, to a semiconductor device including at least two dies and method of manufacturing the same.

2. Description of the Related Art

Conventionally, a fan-out wafer level packaging structure contains multiple dies, an encapsulant surrounding the dies, and a redistribution layer electrically connecting the dies, where the redistribution layer is arranged on the dies and the encapsulant. However, the die to die connection may include different materials and can involve a heterojunction structure, which may lead to serious warpage problems or even breaking of a trace at a bent portion of the trace due to differences in the respective coefficients of thermal expansion of the different materials. It is desirable to provide a semiconductor device and the process for manufacturing the same that may resolve the issues mentioned above.

SUMMARY

In some embodiments, according to one aspect, a semiconductor device includes a first die, a second die, a first dielectric layer, and at least one first trace. The first die has a first surface and a second surface opposite to the first surface and includes at least one first pad disposed adjacent to the first surface of the first die. The second die has a first surface and a second surface opposite to the first surface and includes at least one second pad disposed adjacent to the first surface of the second die. The semiconductor device further includes the first trace disposed on the first dielectric layer and connecting the first pad to the second pad, the first trace having an end portion adjacent to the first pad and a body portion, wherein the end portion is disposed at an angle $\theta_1$ relative to a direction of extension of the body portion.

In some embodiments, according to another aspect, a semiconductor device includes a first die, a second die, a first dielectric layer, and at least one first trace. The first die has a first surface, a second surface opposite to the first surface, and a side surface connecting the first surface to the second surface, where the first die includes at least one first pad disposed adjacent to the first surface of the first die. The second die has a first surface, a second surface opposite to the first surface, and a side surface connecting the first surface to the second surface, where the second die includes at least one second pad disposed adjacent to the first surface of the second die. The first dielectric layer is disposed on at least a portion of the first surface of the first die and at least a portion of the first surface of the second die. The first trace is disposed on the first dielectric layer and connects the first pad to the second pad, where the first trace includes a body portion and an end portion and the end portion extends from the body portion to the second pad at an angle $\theta_2$ relative to one or both of the side surfaces of the first die and the second die.

In some embodiments, according to another aspect, a method of manufacturing a semiconductor device, comprising providing a first die having a first surface and a second surface opposite to the first surface, the first die comprising at least one first pad disposed adjacent to the first surface of the first die; providing a second die having a first surface and a second surface opposite to the first surface, the second die comprising at least one second pad adjacent to the first surface of the second die; disposing a dielectric layer on at least a portion of the first surface of the first die and at least a portion of the first surface of the second die; and disposing at least one first trace on the dielectric layer which connects the first pad to the second pad, the first trace having an end portion disposed adjacent to the first pad and a body portion, wherein the end portion is disposed at a non-zero angle relative to a direction of extension of the body portion.

DETAILED DESCRIPTION

Spatial descriptions, such as "above," "below," "top," "side," "lower" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
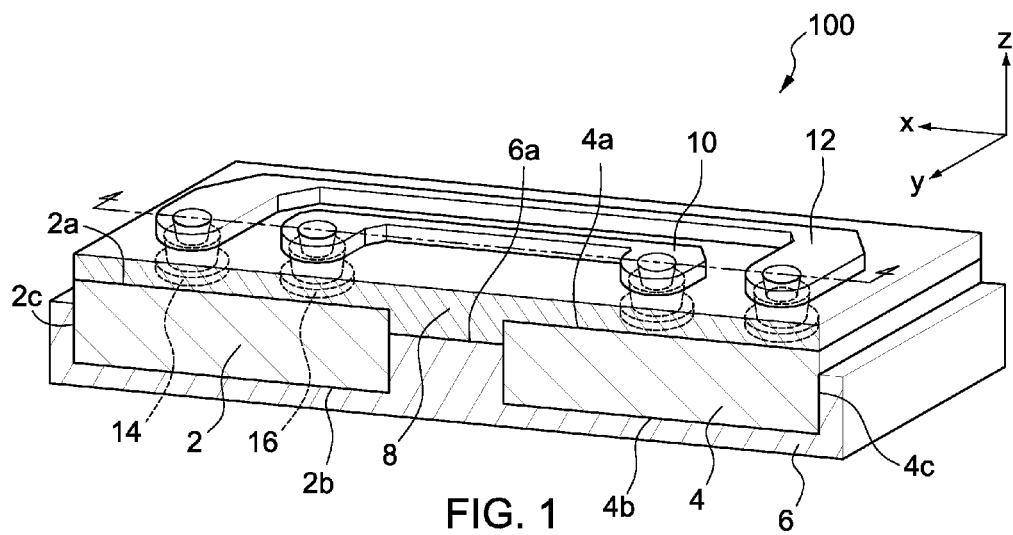
FIG. 1 illustrates a perspective view of a semiconductor device according to some embodiments of the present disclosure.
Figure 2:
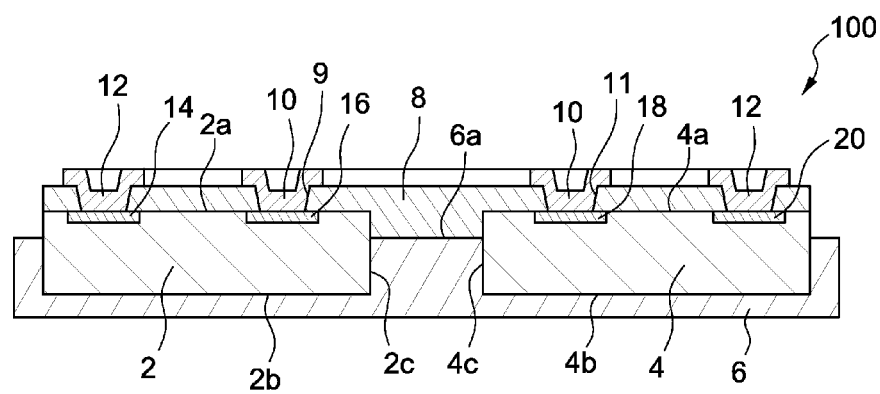
FIG. 2 illustrates a cross-section view of the embodiments depicted in FIG. 1.
Figure 3:
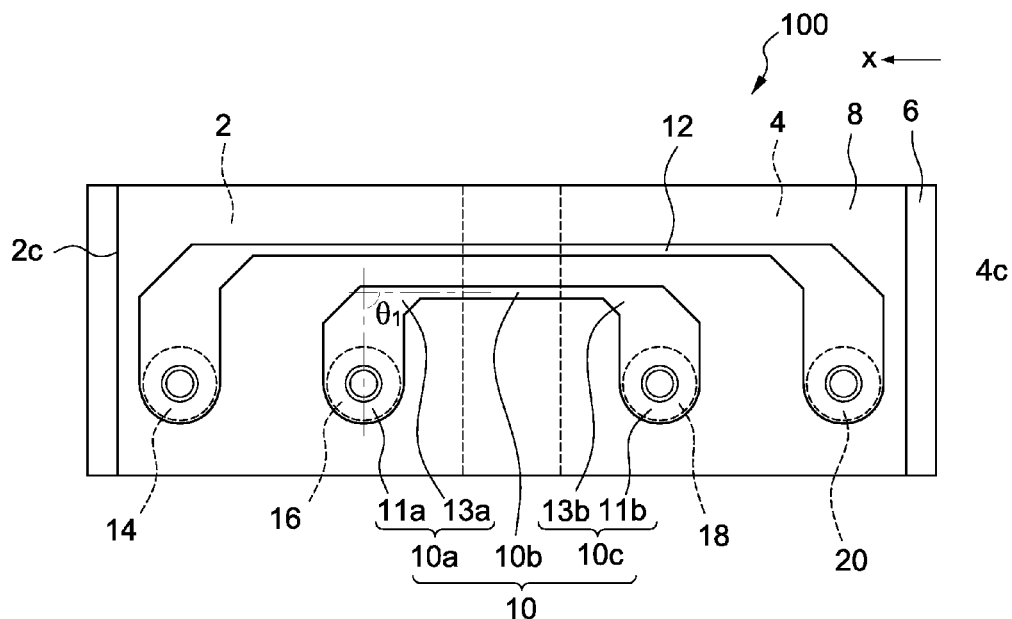
FIG. 3 illustrates a vertical view of the embodiments depicted in FIG. 1.

FIG. 1 illustrates a perspective view of a semiconductor device 100 according to some embodiments of the present disclosure; FIG. 2 illustrates a cross-section view of the embodiments in FIG. 1; and FIG. 3 illustrates a vertical view of the embodiments in FIG. 1. The semiconductor device 100 includes a first die 2, a second die 4, an encapsulant 6, a first dielectric layer 8, and one or more first traces 10 and 12.

The first die 2 has a first surface 2a, a second surface 2b opposite to the first surface 2a, and a side surface 2c. The side surface 2c extends from the first surface 2a to the second surface 2b. The first die 2 includes one or more first bonding pads 14 and 16 disposed adjacent to, or embedded in, the first surface 2a of the first die 2. The first bonding pads 14, 16 may be, for example, contact pads of a trace. In the embodiments depicted in FIG. 1, FIG. 2, and FIG. 3, the first surface 2a is an active surface, the first bonding pads 14 and 16 are contact pads, and the first bonding pads 14 and 16 are disposed directly (e.g., in physical contact) on the first surface 2a of the first die 2. The first bonding pads 14 and 16 may independently include, for example, copper, gold, indium, tin, silver, palladium, osmium, iridium, ruthenium, titanium, magnesium, aluminum, cobalt, nickel, or zinc, other metals, metal alloys, or a combination of two or more thereof. The first bonding pads 14, 16 may both include identical and/or different materials from each other.

In some embodiments, the semiconductor device 100 may include an insulation layer (not shown) disposed adjacent to the first surface 2a of the first die 2, the insulation layer defining openings that expose the first bonding pads 14 and 16, respectively.

The second die 4 has a first surface 4a, a second surface 4b opposite to the first surface 4a, and a side surface 4c. The side surface 4c extends from the first surface 4a to the second surface 4b. The second die 4 includes one or more second bonding pads 18 and 20 disposed adjacent to, or embedded in, the first surface 4a of the second die 4. The second bonding pads 18 and 20 may be, for example, contact pads of a trace. In the embodiments depicted in FIG. 1, FIG. 2, and FIG. 3, the first surface 4a is an active surface, the second bonding pads 18 and 20 are contact pads, and the second bonding pads 18 and 20 are disposed directly (e.g., in physical contact) on the first surface 4a of the second die 4. The second bonding pads 18 and 20 may independently include, for example, copper, gold, indium, tin, silver, palladium, osmium, iridium, ruthenium, titanium, magnesium, aluminum, cobalt, nickel, or zinc, other metals, metal alloys, or a combination of two or more thereof.

In some embodiments, the semiconductor device 100 may include an insulation layer (not shown) disposed adjacent to the first surface 4a of the first die 4, the insulation layer defining openings that expose the second bonding pads 18 and 20, respectively.

The first die 2 and the second die 4 may be spaced apart from each other by a distance. The first die 2 and the second die 4 may be disposed on a same or different level or plane. The first die 2 and the second die 4 may be of the same type (e.g., may include a same integrated circuit design), or may be of different types (e.g., may include different integrated circuit designs). Further, the first die 2 and the second die 4 may have similar sizes or different sizes. For example, as shown in the embodiments depicted in FIG. 1 and FIG. 2, the first die 2 is positioned at substantially the same level as the second die 4 and the sizes of the two dies are similar.

The encapsulant 6 is disposed such that it surrounds at least a portion the first die 2 and the second die 4, each portion including at least one edge of the corresponding die. Specifically, as shown in the embodiments depicted in FIG. 1 and FIG. 2, the space between the first die 2 and the second die 4 is filled with the encapsulant 6. In other embodiments, different encapsulants can be in contact with different dies. For example, a first encapsulant can surround at least a portion of the first die 2, and a second encapsulant can surround at least a portion of the second die. The encapsulant 6 has a first surface 6a. The first surface 6a may be disposed on a same plane as, or on a plane lower than, one or both first surfaces 2a and 4a of the first die 2 and the second die 4. For example, FIG. 1 and FIG. 2 depict embodiments in which the first surface 6a of the encapsulant 6 is lower than both of the first surfaces 2a and 4a of the first die 2 and the second die 4. The material of the encapsulant 6 may include but is not limited to an epoxy resin, a molding compound, and/or a composite material such as a composite material including epoxy resin and $SiO_2$ filler.

The first dielectric layer 8 is disposed adjacent to the first surface 2a of the first die 2, the first surface 4a of the second die 4, and the first surface 6a of the encapsulant 6. The dielectric layer 8 may cover at least a portion of the first surface 2a of the first die 2, at least a portion of the first surface 4a of the second die 4, and at least a portion of the first surface 6a of the encapsulant 6. As shown in the embodiments depicted in FIG. 1 and FIG. 2, the first dielectric layer 8 extends along with the x-direction from a location adjacent to the first surface 4a of the second die 4 to a location adjacent to the first surface 2a of the first die 2, and extends across the space between the first die 2 and the second die 4. The first dielectric layer 8 defines openings 9 that expose the first bonding pads 14 and 16, and further defines openings 11 that expose the second bonding pads 18 and 20. The first dielectric layer 8 may extend beyond both the first bonding pad 14 and the second bonding pad 20 (e.g., may extend beyond all bonding pads of the first die and the second die), as depicted in FIG. 1 and FIG. 2. In other embodiments, the first dielectric layer 8 may be less extensive. In some embodiments, the dielectric layer 8 may be a solder mask.

The first traces 10 and 12 are disposed on the dielectric layer 8. The first traces 10 and 12 extend from the second die 4 to the first die 2 and extend across the space between the first die 2 and the second die 4. As shown in FIG. 3, the first trace 10 includes a first end 10a, a body 10b, and a second end 10c. The first end 10a, the body 10b, and the second end 10c also may be referred to as a first end portion 10a, a body portion 10b, and a second end portion 10c, respectively. The first end 10a and the second end 10b extend from the body 10b. The first end 10a may further include contact portion 11a and extension portion 13a. The second end 10c may further include contact portion 11b and extension portion 13b. The extension portion 13a connects the body 10b to the contact portion 11a, and the extension portion 13b connects the body 10b to the contact portion 11b. As shown in FIG. 1 and FIG. 3, the extension portions 13a and 13b can be wider than the body 10b and can enhance the strength thereof and reduce or eliminate breaking of the first trace 10. The contact portion 11b electrically connects the first die 2 to the first trace 10 through the first bonding pads 14 and 16, and the contact portion 11a electrically connects the second die 4 to the first trace 10 through the second bonding pads 18 and 20 of the second die 4 exposed by the respective opening of the dielectric layer 8. The first trace 12 can, in some embodiments, be similar to the first trace 10, and can include similar first end, second end, and body portions. The first traces 10 and/or 12 can include a metal, a metal alloy, or another electrically conductive material.

The contact portion 11a is disposed such that a line passing through a center of the contact portion 11a intersects a direction of extension of the body 10b at an angle $\theta_1$. Such a relationship will be referred to herein as contact portion 11a being disposed at an angle $\theta_1$ relative to the body 10b. Similarly, the contact portions 11b is disposed such that a line passing through a center of the contact portion 11b intersects the direction of extension of the body 10b at the angle $\theta_1$ (i.e. the contact portion 11b is disposed at the angle $\theta_1$ relative to the body 10b). The angle $\theta_1$ can be in a range from about 0° to about 15°, from about 0° to about 30°, from about 0° to about 45°, from about 0° to about 60°, from about 0° to about 75°, from about 0° to about 90°, from about 0° to about 105°, from about 0° to about 120°, from about 0° to about 135°, from about 0° to about 150°, from about 0° to about 165°, from about 0° to about 180°, or from about 15° to 165°. In some embodiments, the angle $\theta_1$ is a non-zero angle, such as a non-zero angle within the foregoing stated ranges. In the example embodiments depicted in FIG. 1, FIG. 2, and FIG. 3, the angle $\theta_1$ is approximately 90°. Because the contact portions 11a and 11b of the first trace 10 are disposed at the angle $\theta_1$ relative to the body 10b, stress otherwise generated at the extension portions 13a, 13b along the x-direction (direction of extension of the body 10b) due to the warpage of the dies can be reduced or eliminated. Thus, the trace may break less often. In other embodiments, the contact portions 11a and 11b may be disposed at the same or different angles relative to the body 10b.

Figure 4:
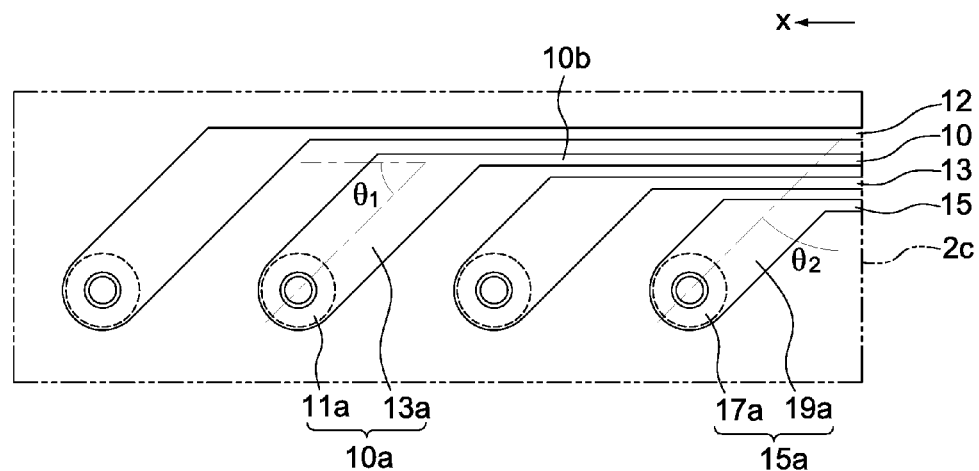
FIG. 4 illustrates a vertical view of some embodiments of a semiconductor device.

FIG. 4 illustrates a vertical view of some embodiments of a semiconductor device 100. As shown in the embodiments of FIG. 4, four first traces are included: 10, 12, 13, and 15. The angle $\theta_1$ at which the contact portions 11a of the first trace 10 is disposed relative to the body 10b is approximately 45°.

In some embodiments, the contact portion 17a of a first end 15a of the first trace 15 can be disposed at an angle $\theta_2$ relative to the side surface 2c of the first die 2 and/or the side surface 4c of the second die 4. The angle $\theta_2$ can be in a range from about 0° to about 15°, from about 0° to about 30°, from about 0° to about 45°, from about 0° to about 60°, from about 0° to about 75°, from about 0° to about 90°, from about 0° to about 105°, from about 0° to about 120°, from about 0° to about 135°, from about 0° to about 150°, from about 0° to about 165°, from about 0° to about 180°, from about 0° to about −15°, from about 0° to about −30°, from about 0° to about −45°, from about 0° to about −60°, from about 0° to about −75°, from about 0° to about −90°, from about 0° to about −105°, from about 0° to about −120°, from about 0° to about −135°, from about 0° to about −150°, from about 0° to about −165°, from about 0° to about −180°, or from about 15° to about 165°. In some embodiments, the angle $\theta_2$ is an angle different from 90°, such as an angle different from 90° within the foregoing stated ranges. In the embodiments depicted in FIG. 1, FIG. 2, and FIG. 3, the angle $\theta_2$ is 0° (i.e. a line running through the center of the contact portion is parallel to the side surface 2c or 4c). By disposing the contact portion 17a of the first trace 15 at an angle $\theta_2$ relative to the side surface 2c of the first die 2 and/or the side surface 4c of the second die 4, stress otherwise generated at the extension portion 19a along the x-direction (direction of extension of the body 10b) due to warpage of the dies can be reduced or eliminated. Thus, the trace may break less often. The contact portions 11a and 17a be disposed at a same or different angle $\theta_2$.

For example, as shown in FIG. 4, the contact portion 17a of the first end 15a is disposed at an angle of approximately 45° relative to the side surface 2c of the first die 2. The contact portions of the first traces 10, 12, 13 and 15 on the second die 4 can be similarly disposed. As described above, by disposing the contact portions 17a of the first traces 10, 12, 13 and 15 at an angle relative to the body 10b or relative to a side surface of the die, the stress otherwise generated at the extension portions of the first traces 10, 12, 13 and 15 along the x-direction (direction of extension of the body 10b) due to the warpage of the dies can be reduced or eliminated and breakage of the trace may occur less often.

Figure 5:
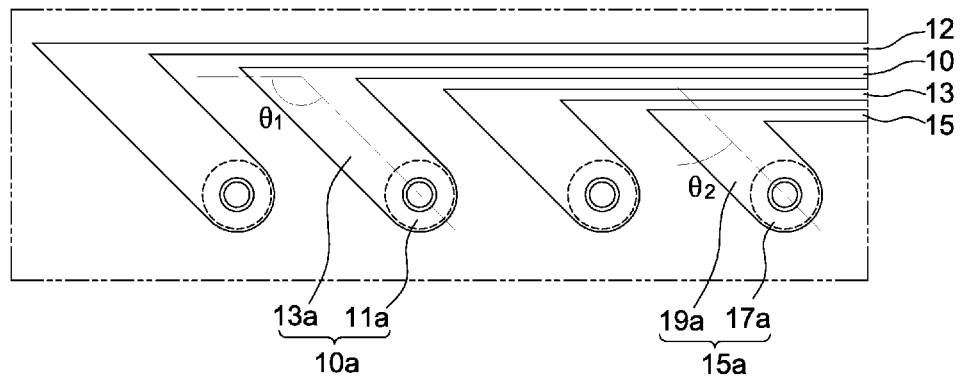
FIG. 5 illustrates a vertical view of some embodiments of a semiconductor device.

FIG. 5 illustrates a vertical view of some embodiments of a semiconductor device 100. The embodiments depicted in FIG. 5 are similar to that illustrated in FIG. 4 except that the angle $\theta_1$ of the contact portion 11a relative to the body 10b and the angle $\theta_2$ of the contact portion 17a relative to the side surface 2c of the first die 2 are different. In the embodiments of FIG. 5, the angle $\theta_1$ of the contact portion 11a in relative to the body 10b is approximately 135°; and the angle $\theta_2$ of the contact portion 17a in relative to the side surface 2c of the first die 2 is approximately −45°. The contact portions of the first traces 10, 12, 13 and 15 on the second die 4 can be similarly disposed.

Figure 6:
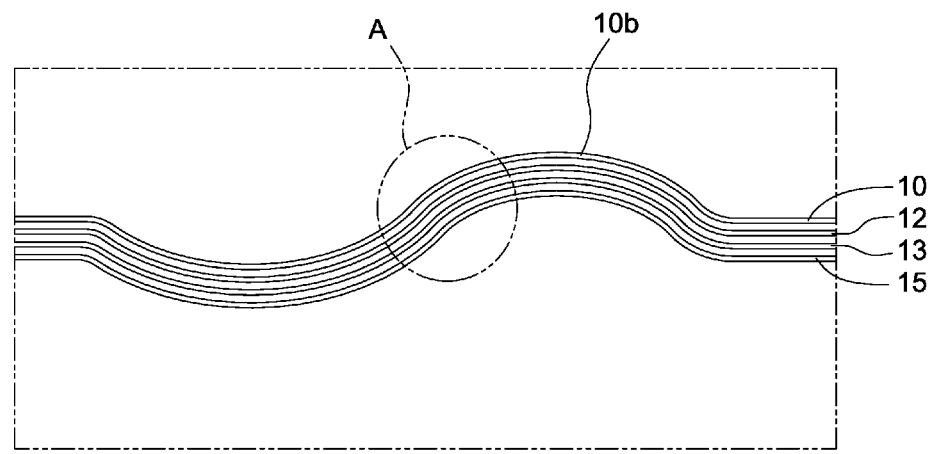
FIG. 6 illustrates a vertical view of some embodiments of a semiconductor device.

FIG. 6 illustrates a vertical view of some embodiments of a semiconductor device 100. The body 10b of each of the first traces 10, 12, 13 and 15 extends from the second die 4 to the first die 2 and across the space between the first die 2 and the second die 4. The body 10b of any of the first traces 10, 12, 13 and 15 can be substantially linear or can have a non-linear portion such as a curved portion, a portion in an S shape, or a portion in a zig zag shape (e.g., a triangular wave shape) so as to reduce or eliminate the stress otherwise generated along with the x-direction. For example, in the embodiments depicted in FIG. 6, the body 10b of each of the first traces 10, 12, 13 and 15 has a portion in an S shape (shown in the region A) disposed in the space between the first die 2 and the second die 4.

Figure 7:
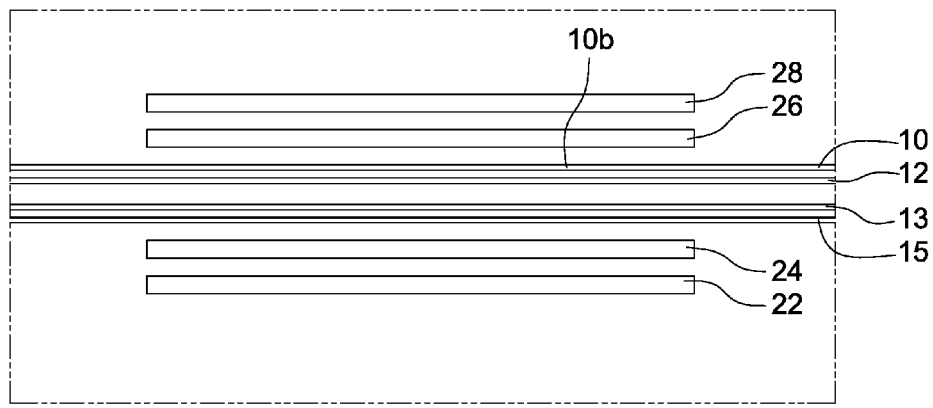
FIG. 7 illustrates a vertical view of some embodiments of a semiconductor device including dummy traces.

FIG. 7 illustrates a vertical view of some embodiments of a semiconductor device 100 that includes the first traces 10, 12, 13 and 15 and dummy traces 22, 24, 26 and 28. As described above, the body 10b of the first traces 10, 12, 13 and 15 can be substantially linear or have a non-linear portion such as a curved portion, a portion in an S shape, or a portion in a zig zag shape. In the embodiments depicted in FIG. 7, the body 10b of the first traces 10, 12, 13 and 15 is substantially linear. In addition, one or more dummy traces 22, 24, 26 and 28 may be disposed adjacent to the first traces 10, 12, 13 and 15 and across the space between the first die 2 and the second die 4 so as to improve the strength of the first traces 10, 12, 13 and 15. The dummy traces 22, 24, 26 and 28 may be disposed above, below, or on the same plane with the first traces 10, 12, 13 and 15. The dummy traces 22, 24, 26 and 28 may be arranged symmetrically around the first traces 10, 12, 13 and 15. For example, as shown in FIG. 7, the dummy traces 22, 24, 26 and 28 are disposed on the same plane as the first traces 10, 12, 13 and 15, and two dummy traces 22, 24 are disposed on a first side of the first traces 10, 12, 13 and 15 and two dummy traces 26 and 28 are disposed on a second side opposite the first side of the first traces 10, 12, 13 and 15.

Figure 8:
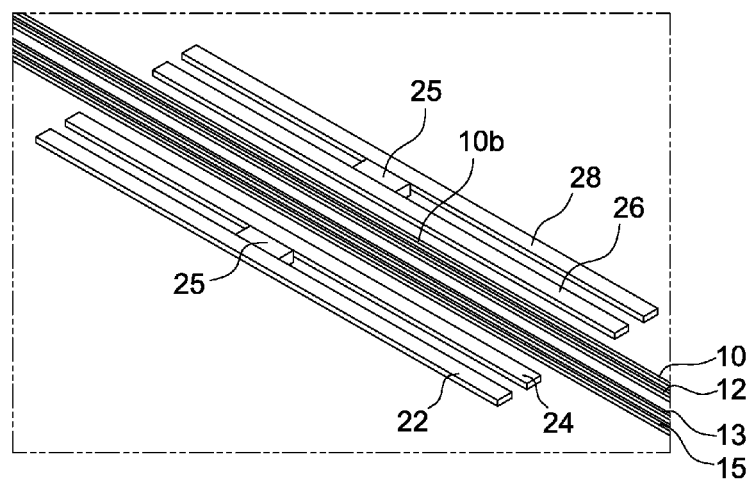
FIG. 8 illustrates a perspective view of some embodiments of a semiconductor device including dummy traces.

FIG. 8 illustrates a perspective view of some embodiments of a semiconductor device 100. The depicted embodiments are similar to that shown in FIG. 7 except that a connection portion 25 is disposed between the dummy traces 22 and 24, and the dummy traces 26 and 28, thereby connecting those pairs of dummy traces. By disposing a connection portion 25 between the dummy traces and connecting them, the strength of the dummy traces and the strength of the traces can be improved.

Figure 9:
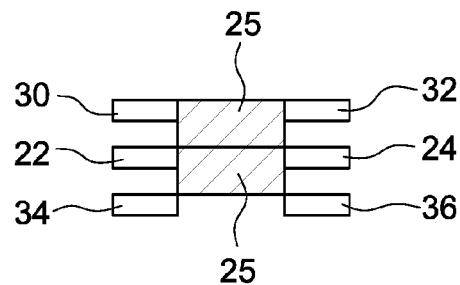
FIG. 9 illustrates a cross-section view of some embodiments of a semiconductor device including dummy traces.

FIG. 9 illustrates a cross section view of some embodiments of a semiconductor device 100. As described above, the dummy traces 22, 24, 26 and 28 may be disposed above, below, or on the same plane with the first traces 10, 12, 13 and 15. In the embodiments depicted in FIG. 9, the dummy traces 22 and 24 are disposed in the same plane as the first traces 10, 12, 13 and 15, the dummy traces 30 and 32 are disposed above the first traces 10, 12, 13 and 15, and the dummy traces 34, 36 are disposed below the first traces 10, 12, 13 and 15. In some embodiments, as shown in FIG. 9, the connection portion 25 can be a via or a stack via.

Figure 10A:
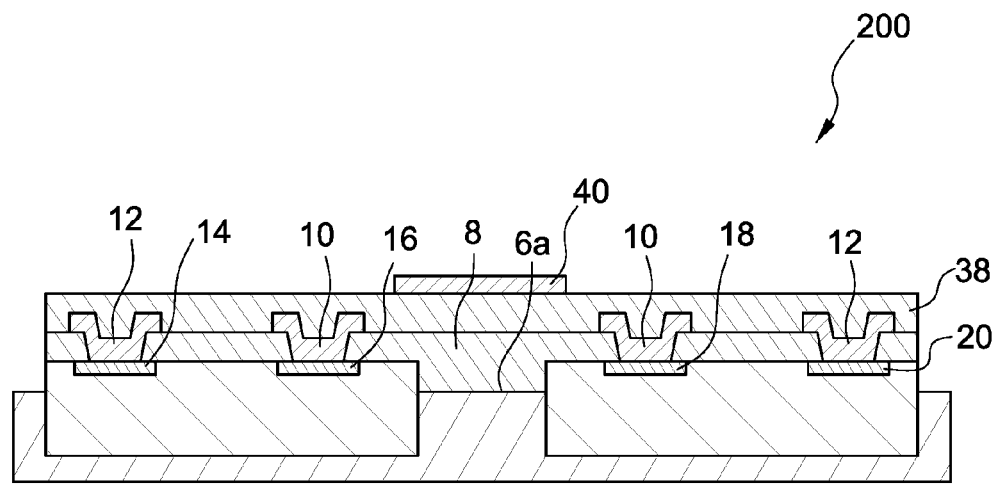
FIG. 10A illustrates a perspective view of a semiconductor device according to some embodiments of the present disclosure.
Figure 10B:
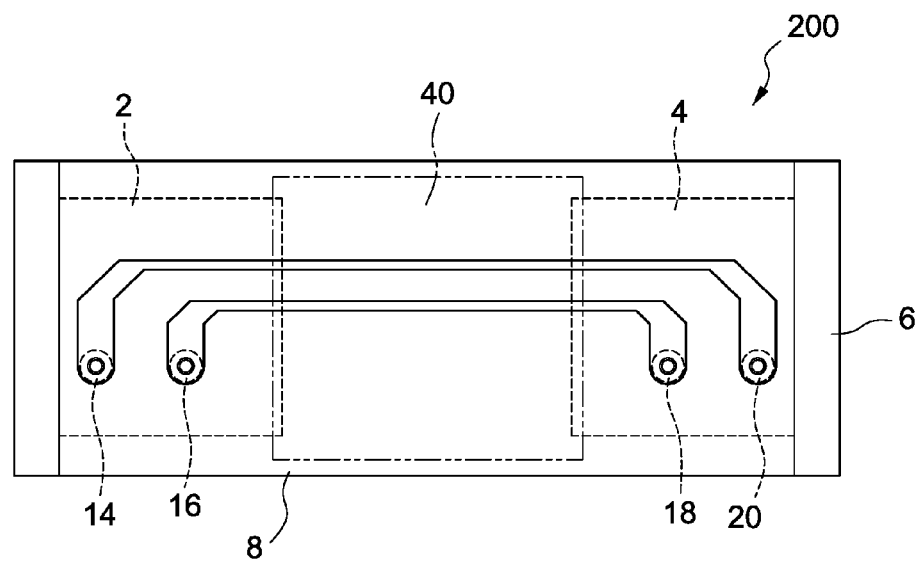
FIG. 10B illustrates a vertical view of the semiconductor device depicted in FIG. 10A.

FIG. 10A illustrates a cross section view of a semiconductor device 200 according to some embodiments of the present disclosure and FIG. 10B illustrates a vertical view of the semiconductor device 200 in FIG. 10A. The semiconductor device 200 is similar to that shown in FIG. 2 and FIG. 3 except that a second dielectric layer 38 is disposed adjacent to the first traces 10, and the first trace 12, and the first dielectric layer 8, and a metal layer 40 is disposed adjacent to the second dielectric layer 38. The second dielectric layer 38 may cover at least a portion of the first traces 10 and 12, including the body portions of those traces. The second dielectric layer 38 may extend beyond both the first bonding pad 14 and the second bonding pad 20 (e.g., may extend beyond all bonding pads of the first die and the second die), as depicted in FIG. 10A. In other embodiments, the second dielectric layer 38 may be less extensive. In the embodiments depicted in FIG. 10A and FIG. 10B, the second dielectric layer 38 covers at least a portion of the first dielectric layer 8 and at least a portion of the first traces 10 and 12 and extends beyond all bonding pads of the first die and the second die.

The metal layer 40 may be directly disposed on (e.g., may be in physical contact with) the second dielectric layer 38. The metal layer 40 may cover at least a portion of the first traces 10 and 12, including the body portions of those traces. In some embodiments, the metal layer 40 may extend beyond both the first bonding pad 14 and the second bonding pad 20 (e.g., may extend beyond all bonding pads of the first die and the second die) In the embodiments depicted in FIG. 10A and FIG. 10B, the metal layer 40 covers the area of the space between the first die 2 and the second die 4 and extends from the second die 4 to the first die 2. By disposing the second dielectric layer 38 and the metal layer 40 as such, the strength of the first traces 10 and 12 can be improved. The metal layer 40 can be, for example, a metal sheet or a metal plate.

Figure 11A:
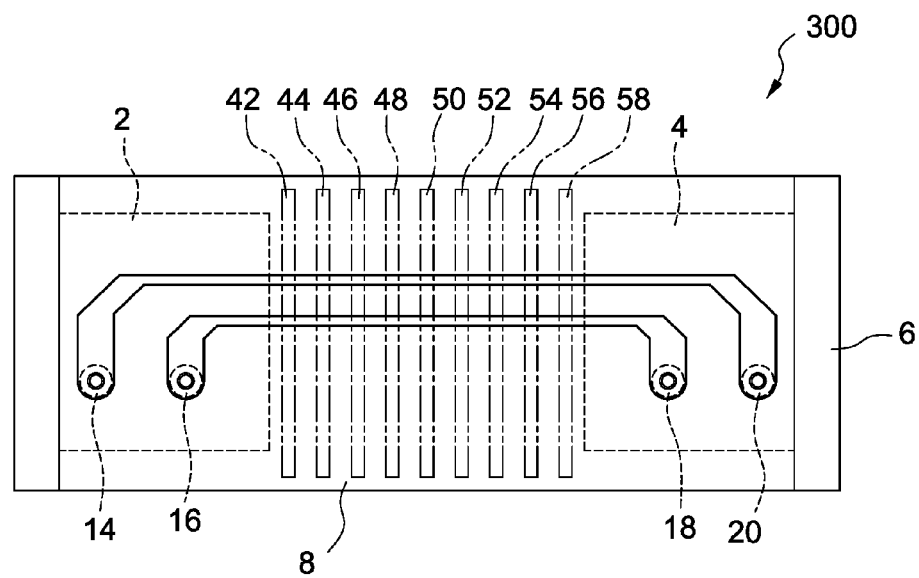
FIG. 11A illustrates a vertical view of a semiconductor device according to some embodiments of the present disclosure.

FIG. 11A illustrates a vertical view of a semiconductor device 300 according to some embodiments of the present disclosure. The semiconductor device 300 is similar to that shown in FIGS. 10A and 10B except that in the depicted embodiments, one or more second traces 42, 44, 46, 48, 50, 52, 54, 56 and 58, rather than a metal layer 40 are disposed on the second dielectric layer 38 in the area between the first die 2 and the second die 4. The second traces 42, 44, 46, 48, 50, 52 and 54 may be arranged in a direction different from the first traces 10 and 12. In the embodiments of FIG. 11A, the second traces are arranged such that they extend in a direction substantially orthogonal to the extension of the first traces 10 and 12.

Figure 11B:
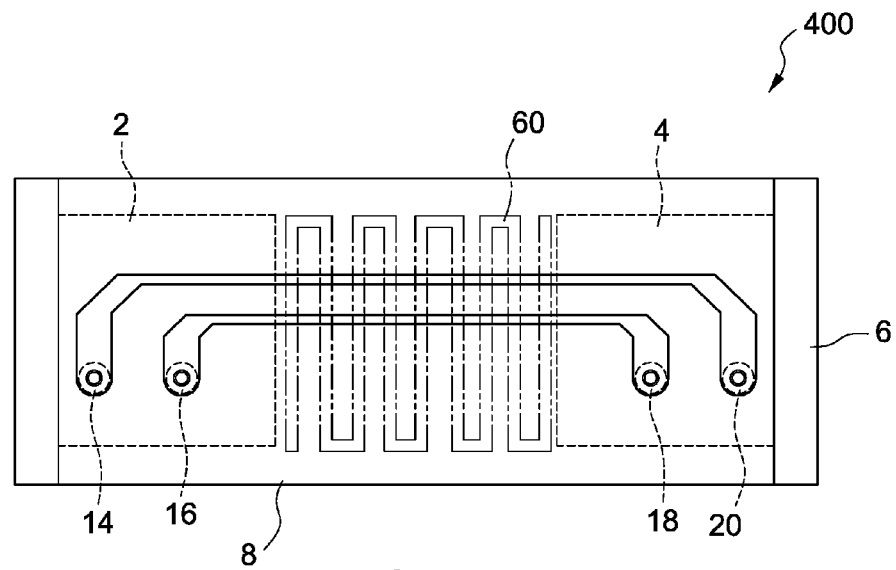
FIG. 11B illustrates a vertical view of a semiconductor device according to some embodiments of the present disclosure.

FIG. 11B illustrates a vertical view of a semiconductor device 400 according to some embodiments of the present disclosure. The semiconductor device 400 is similar to that shown in FIGS. 10A and 10B except that in the depicted embodiments, a second trace 60, rather than a metal layer 40 is disposed on the second dielectric layer 38 in the area between the first die 2 and the second die 4. The second trace 60 may be arranged in a direction different from the first traces 10 and 12. In the embodiments of FIG. 11B, the second trace 60 has a portion in a zig zag shape (e.g., a triangular wave shape) or a fence shape (e.g., a square wave shape). In other embodiments, the second trace 60 may have a different shape.

FIG. 12A, FIG. 12B, FIG. 12C, FIG. 12D, FIG. 12E, and FIG. 12F are cross-sectional views showing a method of manufacturing a semiconductor device 100 in accordance with the embodiments of the semiconductor device 100 shown in FIG. 1, FIG. 2, and FIG. 3.

Figure 12A:
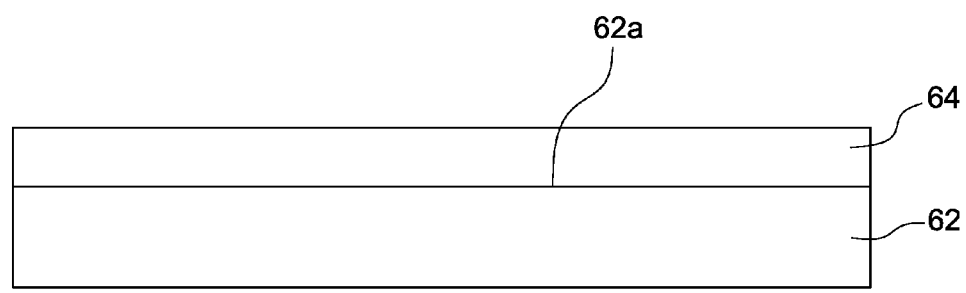
FIG. 12A, FIG. 12B, FIG. 12C, FIG. 12D, FIG. 12E, and FIG. 12F illustrate a manufacturing method in accordance with some embodiments of the present disclosure.

Referring to FIG. 12A, a carrier 62 is provided and an adhesion layer 64 is disposed adjacent to a top surface 62a of the carrier 62.

Figure 12B:
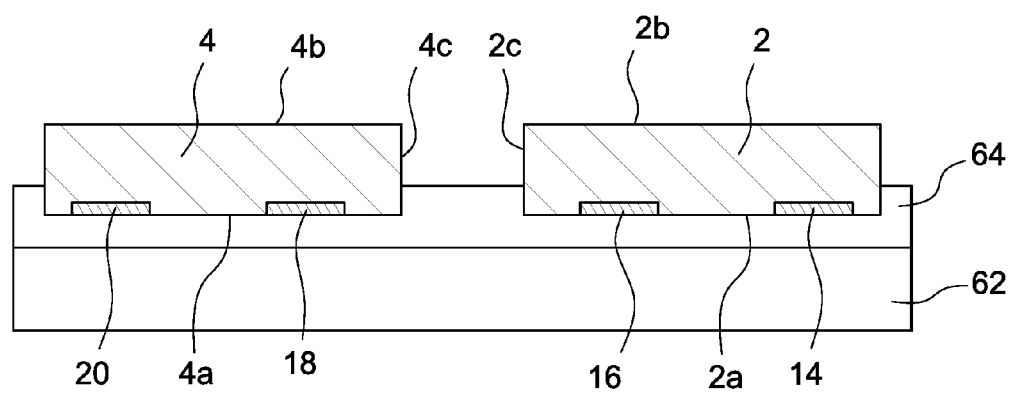

Referring to FIG. 12B, a first die 2 and a second die 4 are disposed adjacent to the adhesion layer 64. The first die 2 has a first active surface 2a, a second surface 2b opposite to the first surface 2a, and a side surface 2c. The side surface 2c extends from the first surface 2a to the second surface 2b. The first die 2 includes one or more first bonding pads 14 and 16 disposed adjacent to the first surface 2a of the first die 2. The second die 4 has a first active surface 4a, a second surface 4b opposite to the first surface 4a, and a side surface 4c. The side surface 4c extends from the first surface 4a to the second surface 4b. The second die 4 includes one or more second bonding pads 18 and 20 disposed adjacent to the first surface 4a of the second die 4. The active surface 2a of the first die 2 and the active surface 4a of the second die 4 substantially face the adhesion layer 64. Due to their weight, the first die 2 and the second die 4 sink into the adhesion layer 64. Therefore, in the illustrated embodiments, the active surface 2a of the first die 2 and the active surface 4a of the second die 4 may be below a top surface of the adhesion layer 64.

Figure 12C:
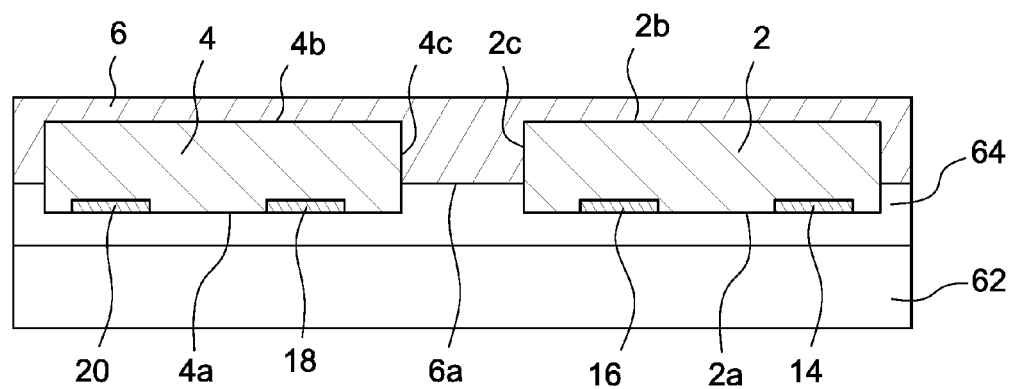

Referring to FIG. 12C, an encapsulant 6 is applied to cover the second surfaces 2b, 4b of the first die 2 and the second die 4, respectively. The encapsulant 6 surrounds at least a portion of the first die 2 and at least a portion of the second die 4 and encloses the at least a portion of peripheral edges of the first die 2 and the second die 4 and fills at least a portion of space between the first die 2 and the second die 4.

Figure 12D:
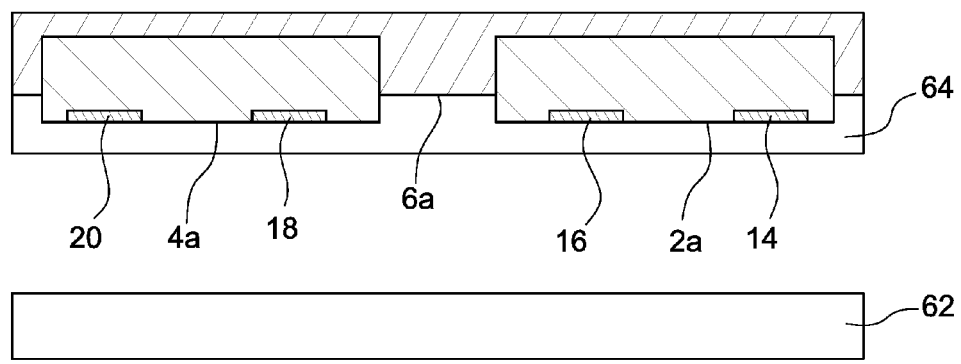

Referring to FIG. 12D, the carrier 62 is removed by a heat process.

Figure 12E:
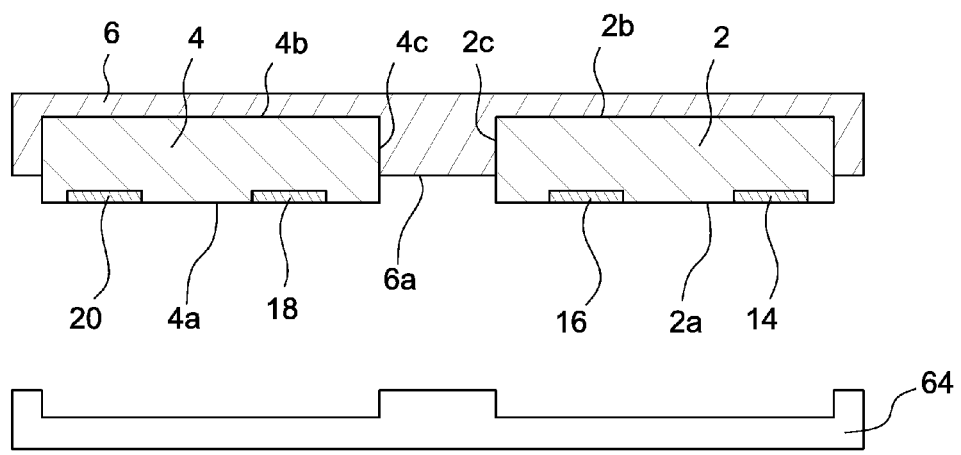

Referring to FIG. 12E, the adhesion layer 64 is removed by a heat process.

Figure 12F:
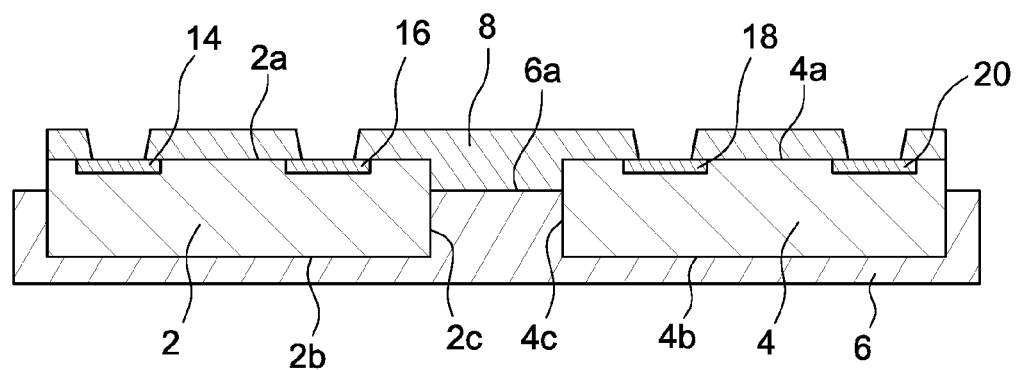

Referring to FIG. 12F, a first dielectric layer 8 is formed to cover at least a portion of the first surface 2a of the first die 2, at least a portion of the first surface 4a of the second die 4, and at least a portion of the first surface 6a of the encapsulant 6. The first dielectric layer 8 defines openings that expose the first bonding pads 14 and 16 and the second bonding pads 18 and 20.

Then, the first traces 10 and 12 are disposed to form a semiconductor device 100 as illustrated in FIG. 2. The first traces 10 and 12 extend from the second die 4 to the first die 2 and extend across the space between the first die 2 and the second die 4. The first traces 10, 12 each have a first end 10a, a body 10b, and a second end 10c. The first end 10a and the second end 10b extend from the body 10b, respectively. The first end 10a and the second end 10c further include contact portions 11a and 11b and extension portions 13a and 13b, respectively. The extension portion 13a connects the body 10b to the contact portion 11a and the extension portion 13b connects the body 10b to the contact portion 11b. The contact portion 11b electrically connects the first die 2 to the first trace 10 through the first bonding pads 14 and 16 exposed by the respective opening of the dielectric layer 8 and the contact portion 11a electrically connects the second die 4 to the first trace 10 through the second bonding pads 18 and 20 of the second die 4 exposed by the respective opening of the dielectric layer 8. The contact portions 11a and 11b are disposed at an angle $\theta_1$ relative to the body 10b.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 µm, no greater than 1 µm, or no greater than 0.5 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device, comprising:
   a first die having a first surface and a second surface opposite to the first surface, the first die comprising at least one first pad disposed adjacent to the first surface of the first die;
   a second die having a first surface and a second surface opposite to the first surface, the second die comprising at least one second pad disposed adjacent to the first surface of the second die;
   a first dielectric layer disposed on at least a portion of the first surface of the first die and at least a portion of the first surface of the second die; and
   at least one first trace disposed on the first dielectric layer and connecting the first pad to the second pad, the first trace comprising an end portion adjacent to the first pad and a body portion, wherein the end portion extends at an angle $\theta_1$ relative to a direction of extension of the body portion.

2. The semiconductor device of claim 1, wherein angle $\theta_1$ is in a range from 15° to 165°.

3. The semiconductor device of claim 1, wherein the end portion is wider than the body portion.

4. The semiconductor device of claim 1, wherein the first dielectric layer defines at least one opening exposing the first pad and at least one opening exposing the second pad, and wherein the end portion of the first trace extends from the body portion of the first trace to either the first pad or the second pad.

5. The semiconductor device of claim 1, wherein the first dielectric layer defines at least one opening exposing the first pad and at least one opening exposing the second pad, and wherein the first dielectric layer extends beyond the first pad of the first die and the second pad of the second die.

6. The semiconductor device of claim 1, further comprising at least one dummy trace disposed on the first dielectric layer adjacent to the first trace.

7. The semiconductor device of claim 6, wherein the dummy trace is disposed above the first trace.

8. The semiconductor device of claim 6, wherein the dummy trace is disposed below the first trace.

9. The semiconductor device of claim 6, wherein the dummy trace and the first trace are disposed on a same plane.

10. The semiconductor device of claim 6, wherein the at least one dummy trace comprises two dummy traces disposed adjacent to the first trace.

11. The semiconductor device of claim 10, further comprising a connection portion connecting the dummy traces to each other.

12. The semiconductor device of claim 11, wherein the connection portion is a via.

13. The semiconductor device of claim 1, wherein the body portion of the first trace further comprises a curved portion between the first die and the second die.

14. The semiconductor device of claim 1, further comprising a second dielectric layer disposed above the first trace and a metal layer disposed above the second dielectric layer.

15. The semiconductor device of claim 1, further comprising a second dielectric layer disposed above the first trace and at least one second trace disposed above the second dielectric layer, wherein the second trace is disposed substantially orthogonal to the first trace.

16. The semiconductor device of claim 1, further comprising a second dielectric layer disposed above the first trace and a second trace disposed above the second dielectric layer, wherein the second trace has a portion in a triangular wave shape.

17. The semiconductor device of claim 1, further comprising a second dielectric layer disposed above the first trace and a second trace disposed above the second dielectric layer, wherein the second trace has a portion in a square wave shape.

18. A semiconductor device, comprising:
   a first die having a first surface, a second surface opposite to the first surface, and a side surface connecting the first surface to the second surface, the first die comprising at least one first pad disposed adjacent to the first surface of the first die;
   a second die having a first surface, a second surface opposite to the first surface, and a side surface connecting the first surface to the second surface, the second die comprising at least one second pad disposed adjacent to the first surface of the second die;

a first dielectric layer disposed on at least a portion of the first surface of the first die and at least a portion of the first surface of the second die; and at least one first trace disposed on the first dielectric layer and connecting the first pad to the second pad, the first trace comprising a body portion and an end portion, wherein the end portion extends from the body portion to the second pad at an angle $\theta_2$ relative to one or both of the side surfaces of the first die and the second die.

19. The semiconductor device of claim 1, wherein the angle $\theta_2$ is in a range from 15° to 165°.

20. The semiconductor device of claim 1, wherein the end portion is wider than the body portion.

21. The semiconductor device of claim 1, wherein the first dielectric layer defines at least one opening exposing the first pad and at least one opening exposing the second pad.

22. The semiconductor device of claim 1, further comprising two dummy traces disposed on the dielectric layer adjacent to the first trace.

23. The semiconductor device of claim 22, further comprising a connection portion connecting the dummy traces to each other.

24. A method of manufacturing a semiconductor device, comprising:

providing a first die having a first surface and a second surface opposite to the first surface, the first die comprising at least one first pad disposed adjacent to the first surface of the first die;

providing a second die having a first surface and a second surface opposite to the first surface, the second die comprising at least one second pad disposed adjacent to the first surface of the second die;

disposing a dielectric layer on at least a portion of the first surface of the first die and at least a portion of the first surface of the second die; and disposing at least one trace on the dielectric layer which connects the first pad to the second pad, the first trace comprising an end portion disposed adjacent to the first pad and a body portion, wherein the end portion is disposed at a non-zero angle relative to a direction of extension of the body portion.

\* \* \* \* \*